(12) United States Patent
Amadi et al.

(10) Patent No.: US 9,287,839 B1
(45) Date of Patent: Mar. 15, 2016

(54) FEEDBACK LOOP FOR DIRECT CURRENT (DC) OFFSET REMOVAL

(71) Applicant: Cirrus Logic, Inc., Austin, TX (US)

(72) Inventors: Christophe Jean-Francois Amadi, Austin, TX (US); Jason Lee Wardlaw, Austin, TX (US); Emmanuel A. Marchais, Dripping Springs, TX (US); Dylan Alexander Hester, Austin, TX (US); Daniel John Allen, Austin, TX (US); John Christopher Tucker, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 47 days.

(21) Appl. No.: 14/056,108

(22) Filed: Oct. 17, 2013

(51) Int. Cl.
*H03F 3/45* (2006.01)
*H03F 1/34* (2006.01)
*H03F 1/02* (2006.01)
*H03G 3/32* (2006.01)

(52) U.S. Cl.
CPC .............. *H03F 3/45659* (2013.01); *H03F 1/02* (2013.01); *H03F 1/34* (2013.01); *H03F 3/45475* (2013.01); *H03G 3/32* (2013.01)

(58) Field of Classification Search
CPC .......... H03G 3/32; H03F 1/02; H03F 3/45475
USPC .......................... 330/9, 69, 258; 381/120–122
See application file for complete search history.

(56) References Cited

U.S. PATENT DOCUMENTS

| 5,844,442 | A  | * | 12/1998 | Brehmer | ............. H03F 3/45179 330/258 |
|---|---|---|---|---|---|
| 8,525,710 | B1 | * | 9/2013 | Tsang et al. | ................... 341/118 |
| 8,624,669 | B2 | * | 1/2014 | Lesso | ................. 330/9 |
| 8,824,703 | B2 | * | 9/2014 | Lesso | ............. 381/121 |
| 8,855,335 | B2 | * | 10/2014 | Henriksen | ............. H03F 1/3211 341/118 |
| 2008/0084236 | A1 | * | 4/2008 | Chung | ......................... 327/307 |
| 2014/0037112 | A1 | * | 2/2014 | Lee | ........................... H03F 1/56 381/120 |

OTHER PUBLICATIONS

A Brief Introduction to Sigma Delta Conversion, Intersil AN 9504, May 1995.*
Wikepedia definition of Pro Audio, http /en.wikipedia_orQfwikifProfessional audio.*
Dobkin and Williams, Chapter 21 "Composite Amplifiers" from Linear Technology's vol. II book entitled, "Analog Circuit Design—Immersion in the Black Art of analog design" published by Elsevier/Newnes.

(Continued)

*Primary Examiner* — Steven J Mottola
*Assistant Examiner* — Hafizur Rahman
(74) *Attorney, Agent, or Firm* — Norton Rose Fulbright US LLP (57) ABSTRACT

A DC servo loop may track DC offset changes of an input signal and apply feedback to amplifiers to adjust a DC offset of the input signal. The DC servo loop may include digital loop tracking and analog loop tracking components. The digital loop tracking components may track small changes in the DC offset. When the DC offset exceeds a certain threshold, analog loop tracking may be activated to apply feedback to the amplifiers to adjust the DC offset. The adjustments to the DC offset may be delayed until an amplitude of the input signal exceeds a threshold to reduce contribution to noise in the input signal.

22 Claims, 5 Drawing Sheets

(56) References Cited

OTHER PUBLICATIONS

Jawed et al., "A Multifunction Low-Power Preamplifier for MEMS Capacitive Microphones", IEEE, Jun. 2009, Digital Audio Group, Analog Devices, Denmark.

Jiang et al., "A 40 nm CMOS Analog Front End with Enhanced Audio for HSPA/EDGE Multimedia Applications", IEEE, 2012, Broadcom Corporation, Irvine, CA 92617 USA.

Barbieri and Nicollini, "100 dB A-Weighted SNR Microphone Preamplifier With On-Chip Decoupling Capacitors", IEEE Journal of Solid-State Circuits, Nov. 2012, vol. 47, No. 11.

* cited by examiner

FEEDBACK LOOP FOR DIRECT CURRENT (DC) OFFSET REMOVAL

FIELD OF THE DISCLOSURE

The instant disclosure relates to integrated circuits. More specifically, this disclosure relates to direct current (DC) offset removal in integrated circuits.

BACKGROUND

Figure 1:
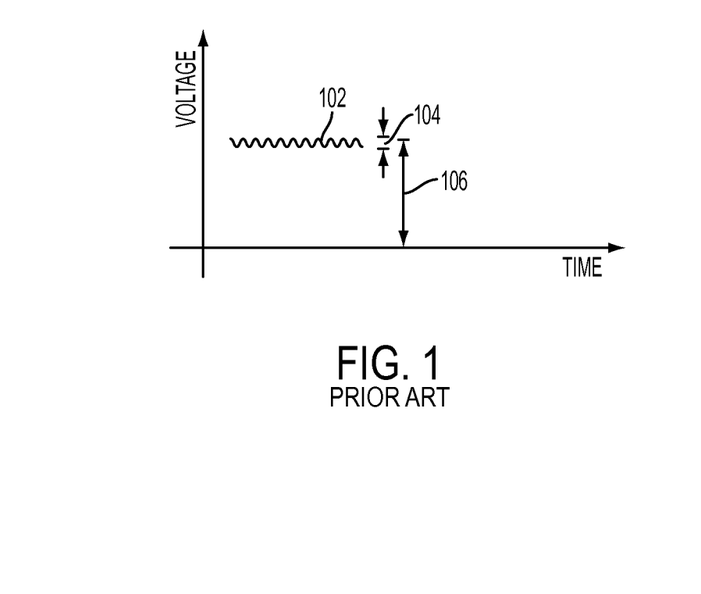
FIG. 1 is a graph illustrating a conventional microphone signal.

A common mode of a signal may refer to a direct current (DC) component of a signal. When a signal is transmitted from one electronic component to another electronic component, the common mode must be compensated for, such that the signal does not saturate or otherwise affect operation of the other electronic component. Certain signals may contain a large common mode component relative to a signal component. For example, microphone signals often contain a large common mode and a small signal amplitude. FIG. 1 is a graph illustrating a conventional microphone signal. A signal 102 may be a sinusoidal signal with an amplitude 104. The signal 102 may be offset 106 from a ground voltage. The offset 106 may be larger than the amplitude 104 of the signal 102.

When the signal 102 is transmitted from the microphone to an electronic component for processing, the offset 106 may cause problems in the electronic component. For example, the offset 106 of the signal 102 may be larger than a desired operating range of the electronic component. Electronic components, such as amplifiers or analog-to-digital converters (ADCs), receiving the signal 102 may have little to no sensitivity to the amplitude 104 of the signal because the offset 106 saturates the electronic components.

Conventionally, the offset 106 is adjusted by shifting the signal 102 to a lower voltage. However, this shift in the DC offset, or common mode, of the signal 102 may create audible defects in the shifted signal.

Figure 2:
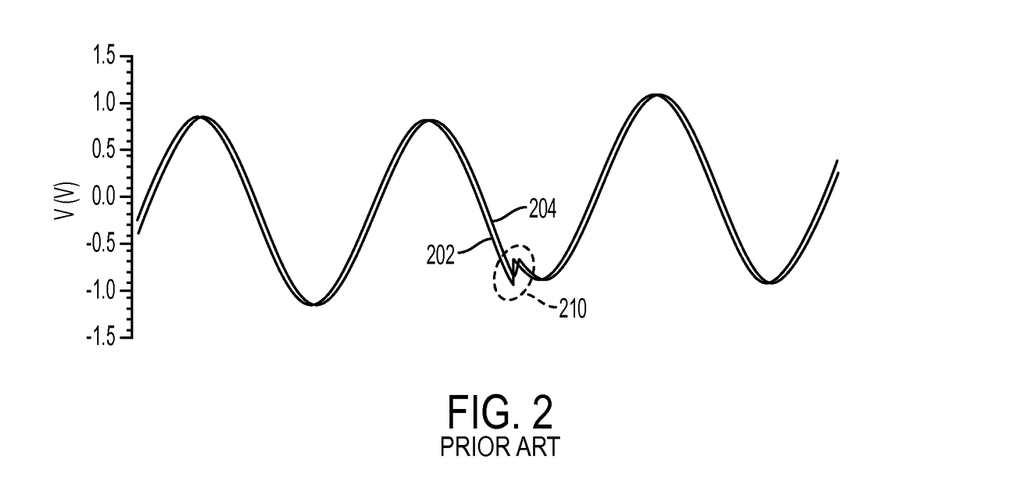
FIG. 2 is a graph illustrating the effect of a DC offset shift on an audio signal.

FIG. 2 is a graph illustrating the effect of an instantaneous DC offset shift on an audio signal. A line 202 illustrates a signal with a filtered DC step at time 210. The DC step at time 210 creates a glitch in the output of the signal shown at line 204. The DC step from a first common mode of the microphone to a second common mode of the electronic components allows the electronic components to operate in desired voltage ranges. However, the glitch in the signal due to the DC step is undesirable. For example, when the line 202 represents an audio signal from a microphone and the line 204 represents the processed audio signal, the audio signal has been audible altered from the originally measured audio signal from the microphone.

One conventional solution is the placement of a capacitor acting as a blocking capacitor to remove the DC offset component of the audio signal. However, the capacitor size is large, requiring placement of the capacitor as an external discrete component. This external capacitor prevents complete integration of the integrated circuit. Furthermore, the input impedance to the capacitor should be large enough to create a low frequency pole (e.g., below the lower limit of audible range at 20 Hz) to prevent degradation of the audio signal.

Shortcomings mentioned here are only representative and are included simply to highlight that a need exists for improved integrated circuits, particularly for consumer-level devices. Embodiments described here address certain shortcomings but not necessarily each and every one described here or known in the art.

SUMMARY

In certain embodiments, the glitches in signals after undergoing a direct current (DC) step from a first common mode of an input electronic component to a second common mode of a second electronic component may be reduced through the use of a DC servo loop to generate pulses such that the DC offset appears as a ramp. The pulses may be generated by a modulator before a digital-to-analog converter (DAC) to produce small DC offset steps that are inaudible to the human ear. The DC servo loop may include a feedback loop to adjust the first common mode of the input signal to a second common for use with other electronic components, such as integrated circuits for processing the input signal. The feedback loop of the DC servo loop may include the modulator that introduces small steps to the signal. The output of the modulator may control feedback to amplifiers coupled between the modulator and the analog-to-digital converter (ADC).

The DC servo loop may operate two feedback modes, a digital loop tracking mode and an analog loop tracking mode. The digital loop tracking mode may operate to track small DC offset changes of an input signal during operation of a circuit processing the input signal. When the DC offset exceeds a certain threshold, the analog loop tracking mode is activated to transfer accumulated DC offset changes during the digital loop tracking to the amplifier receiving the input signal. The operation of the analog loop tracking mode may be delayed until an amplitude of the input signal exceeds a certain threshold, such that noise introduced by the analog loop tracking is masked by the input signal.

The circuits and method described below allow coupling of a sensor to an integrated circuit for processing of the sensor signal by the integrated circuit when the common mode of the sensor signal differs from the common mode of the integrated circuit. For example, integrated circuits, such as those in mobile devices, often operate from a low-voltage power supply. In contrast, many sensors, including micro-electromechanical system (MEMS) microphones, have small signals with a large DC offset, in which the DC offset may exceed the low-voltage power supply of the integrated circuit. The DC servo loop and other components of the circuits described below may allow the coupling of the sensor to the integrated circuit without use of large off-chip capacitors.

According to one embodiment, an apparatus may include an input node configured to receive an input signal. The apparatus may also include an amplifier comprising a first amplifier input node, a second amplifier input node, and an amplifier output node, in which the first amplifier input node is coupled to the input node. The apparatus may further include a feedback loop coupled to the second amplifier input, in which the feedback loop is configured to adjust a first common mode of the input signal to control a second common mode of an output signal at the amplifier output node.

The apparatus may also include an analog-to-digital converter (ADC) coupled to the amplifier output node, in which the first common mode is a common mode of the microphone input, and in which the second common mode is a common mode of the analog-to-digital (ADC) converter, a second input node configured to receive a second input signal, the second input signal comprising noise common to the first input signal and the second input signal, a second amplifier comprising a third amplifier input node, a fourth amplifier input node, and a second amplifier output node, in which the third amplifier input node is coupled to the second input node, and in which the fourth amplifier input node is coupled to the feedback loop, and/or a capacitor coupled between a ground and the second amplifier input node and a second capacitor coupled between the ground and the fourth amplifier input node.

In certain embodiments, the feedback loop may include a mixed-signal servo loop having an analog-to-digital converter (ADC), a digital decimator filter coupled to the analog-to-digital converter (ADC), a digital low-pass filter (LPF) coupled to the digital decimator, a digital integrator coupled to the low-pass filter (LPF), a direct current (DC) modulator coupled to the digital integrator, and a digital-to-analog convert (DAC) coupled to the direct current (DC) modulator; the feedback loop may be configured to perform digital loop tracking through the digital low-pass filter (LPF) and the digital integrator; the feedback loop may be configured to perform analog loop tracking through the digital low-pass filter (LPF), the digital integrator, the DC modulator, and the digital-to-analog converter (DAC); the feedback loop may be configured to perform analog loop tracking to adjust the second common mode of the output signal when the first common mode of the input signal is greater than a first threshold from the second common mode; the feedback loop may be configured to perform digital loop tracking to substantially maintain the second common mode of the output signal when the first common mode of the input signal is less than the first threshold from the second common mode; the feedback loop may be configured to delay analog loop tracking to adjust the second common mode of the output signal until an amplitude of the input signal is above a second threshold; the direct current (DC) modulator may include a delta-sigma modulator configured to perform noise shaping; and/or the input node may include a microphone input, and in which the input signal is an audio input signal.

According to another embodiment, a method may include receiving an input signal, amplifying the input signal to generate an output signal, and adjusting a first common mode of the input signal to a second common mode of the output signal during the step of amplifying the input signal.

In certain embodiments, the step of adjusting the first common mode of the input signal may include adding high frequency noise to the input signal to generate the output signal, the step of adjusting the first common mode of the input signal may include applying feedback during the step of amplifying the input signal, the step of applying feedback may include executing analog loop tracking to adjust the first common mode of the input signal when the first common mode of the input signal is greater than a first threshold from the second common mode, the step of applying feedback may include executing digital loop tracking to adjust the first common mode of the input signal when the first common mode of the input signal is less than a first threshold from the second common mode, the step of executing digital loop tracking may include updating at a first rate, and in which the step of executing analog loop tracking may include updating at a second rate slower than the first rate, and/or the step of receiving an input signal may include receiving a microphone audio signal.

The method may also include delaying the analog loop tracking until a signal level of the input signal is above a second threshold, converting the output signal to a digital signal with an analog-to-digital converter (ADC), in which second common mode is a common mode of the analog-to-digital converter (ADC), calibrating the feedback loop by adjusting a bandwidth of a low-pass filter (LPF), delaying the analog loop tracking until a signal level of the input signal is above a second threshold, and/or filtering the input signal to limit a bandwidth of the input signal to avoid aliasing during sampling of the input signal.

According to a further embodiment, an apparatus may include an input node configured to receive an input signal. The apparatus may also include an amplifier comprising a first amplifier input node, a second amplifier input node, and an amplifier output node, in which the first amplifier input node is coupled to the input node. The apparatus may further include means for adjusting a first common mode of the input signal to a second common mode of an output signal at the amplifier output node.

In certain embodiments, the adjusting means may include means for coarse adjusting of the first common mode to the second common mode and means for fine adjusting of the first common mode to the second common mode, in which the means for coarse adjusting comprises means for analog loop tracking when a signal level of the input signal is greater than a threshold, and in which the means for fine adjusting comprises means for digital loop tracking when a signal level of the input signal is lower than the threshold.

According to another embodiment, an apparatus may include an input node configured to receive an input signal. The apparatus may also include an amplifier having a first amplifier input node, a second amplifier input node, and an amplifier output node. The first amplifier input node may be coupled to the input node, and the amplifier may be configured to adjust a first common mode of the input signal to a second common mode of an output signal at the amplifier output node.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 3:
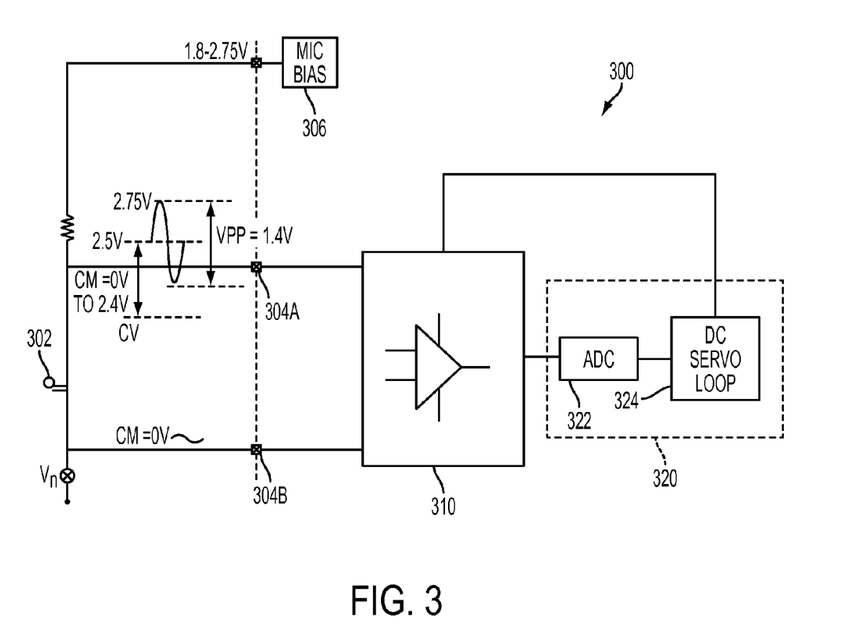
FIG. 3 is a block diagram illustrating an apparatus for adjusting DC offset with a feedback loop according to one embodiment of the disclosure.

FIG. 3 is a block diagram illustrating an apparatus for adjusting DC offset with a feedback loop according to one embodiment of the disclosure. An apparatus 300 may include a microphone 302 coupled to a first input node 304A and a second input node 304B. The microphone 302 may be biased from a microphone bias circuit 306 coupled to the microphone 302. The DC offset of an input signal form the microphone 302 at the input nodes 304A and 304B may range, for example, from approximately 0 Volts to 2.4 Volts. A peak-to-peak amplitude of the input signal may be, for example, approximately 1.4 Volts. Thus, the DC offset of the input signal from the microphone 302 may be larger than the amplitude of input signal from the microphone 302. Although a microphone is described in FIG. 3, the input nodes 304A and 304B may be coupled to any device and receive an input signal from any device.

An amplifier block 310 may be coupled to the input nodes 304A and 304B. The amplifier block 310 may amplify, such as conditioning in a preamplifier, the input signal received at the input nodes 304A and 304B and perform DC offset adjustment of the input signal. Feedback loop components 320 may be coupled to the output of the amplifier block 310. The feedback loop components may process the output signal of the amplifier block 310 and provide an input to the amplifier block 310 to perform DC offset adjustment. For example, the feedback loop components 320 may monitor a second common mode at the output of the amplifier block 310, which may change according to a first common mode of the input signal. The feedback loop components 320 may then provide feedback to the amplifier block 310 to adjust the second common mode to a desired range at a desired time. According to one embodiment, the feedback loop components 320 may time the common mode adjustment to particular times to reduce introduction of glitches to the input signal during adjustment. The feedback loop components 320 may include for example, an analog-to-digital converter 322 and a DC servo loop 324, which are described in further detail below.

Figure 4:
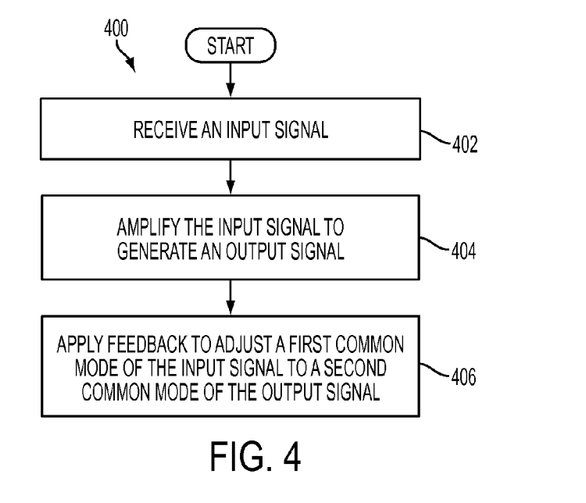
FIG. 4 is a flow chart illustrating a method of adjusting DC offset with a feedback loop according to one embodiment of the disclosure.

FIG. 4 is a flow chart illustrating a method of adjusting DC offset with a feedback loop according to one embodiment of the disclosure. A method 400 may begin at block 402 with receiving an input signal. At block 404, the input signal may be amplified to generate an output signal, such as by preamplifying, conditioning, or buffering the input signal. At block 406, feedback is applied to adjust a first common mode of the input signal to a second common mode of the output signal. Adjusting the first common mode of the input signal to a second common mode may allow the construction of integrated circuits that better integrate with external sensors and devices. For example, a microphone may generate an input signal with a relatively large and varying common mode, and an integrated circuit for processing the input signal from the microphone may operate at a fixed common mode to produce desirable results from the components of the integrated circuit. A signal from the feedback loop may be applied to the amplifiers to produce an adjustment in the DC offset from the first common mode to the second common mode.

Figure 5:
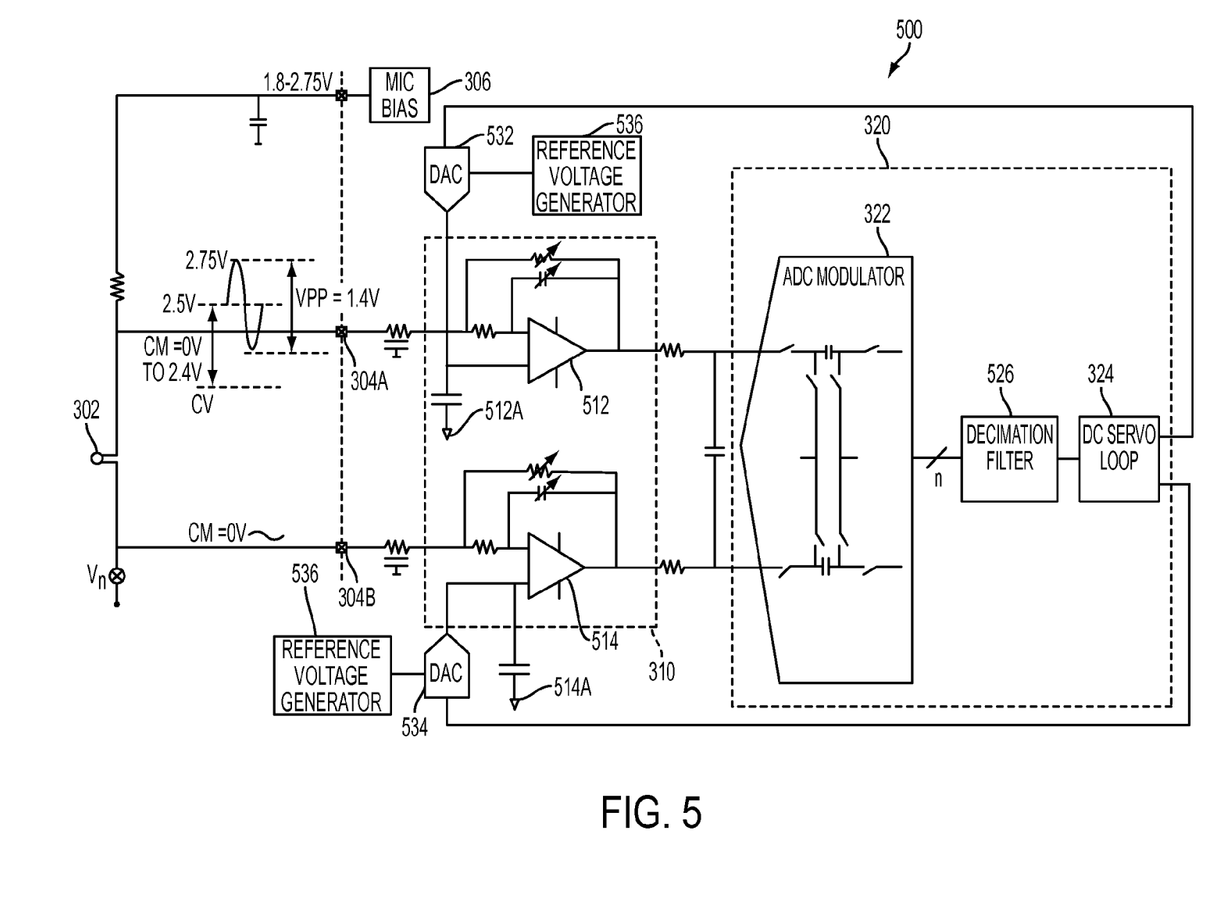
FIG. 5 is a circuit illustrating adjustment of DC offset with a feedback loop according to one embodiment of the disclosure.

FIG. 5 is a circuit 500 illustrating adjustment of DC offset with a feedback loop according to one embodiment of the disclosure. The microphone 302, or other input device, may be coupled to the input nodes 304A and 304B. The amplifier block 310 coupled to the input nodes 304A and 304B may include amplifiers 512 and 514 coupled to the input nodes 304A and 304B, respectively. In this configuration, an input signal may be provided by the microphone 302 to the input nodes 304A and 304B as a differential input signal or as a pseudo-differential signal in which the input node 304A receives signal and ground noise and the input node 304B receives ground and ground noise. According to another embodiment, a capacitor 512A and/or 514A may be coupled to the amplifiers 512 and 514, respectively, within the amplifier block 310 to reduce noise bandwidth. The capacitors 512A and 514A may be integrated with the circuit 500 in an integrated circuit or external to the integrated circuit. The output of the amplifier block 310 may be coupled to feedback components 320, including the ADC modulator 322, which converts the analog output of the amplifier block 310 to a digital signal, a decimation filter 526, and the DC servo loop 324.

Feedback from the DC servo loop 324 may be provided to digital-to-analog converters (DACs) 532 and 534. The DACs 532 and 534 may generate an analog signal for input to the amplifier block 310 as a feedback signal. For example, the DACs 532 and 534 may generate a voltage-mode signal for input to the non-inverting input of the amplifiers 512 and 514, respectively. The DACs 532 and 534 may generate the voltage-mode signal based on a reference voltage provided by a reference voltage generator 536. The reference voltage generator 536 may be shared by the DACs 532 and 534, or two reference voltage generators (not shown) may be separately coupled to the DACs 532 and 534. According to one embodiment, the reference voltage generator 536 may generate a voltage approximately equal to a maximum bias output by the microphone bias circuit 306.

Figure 6:
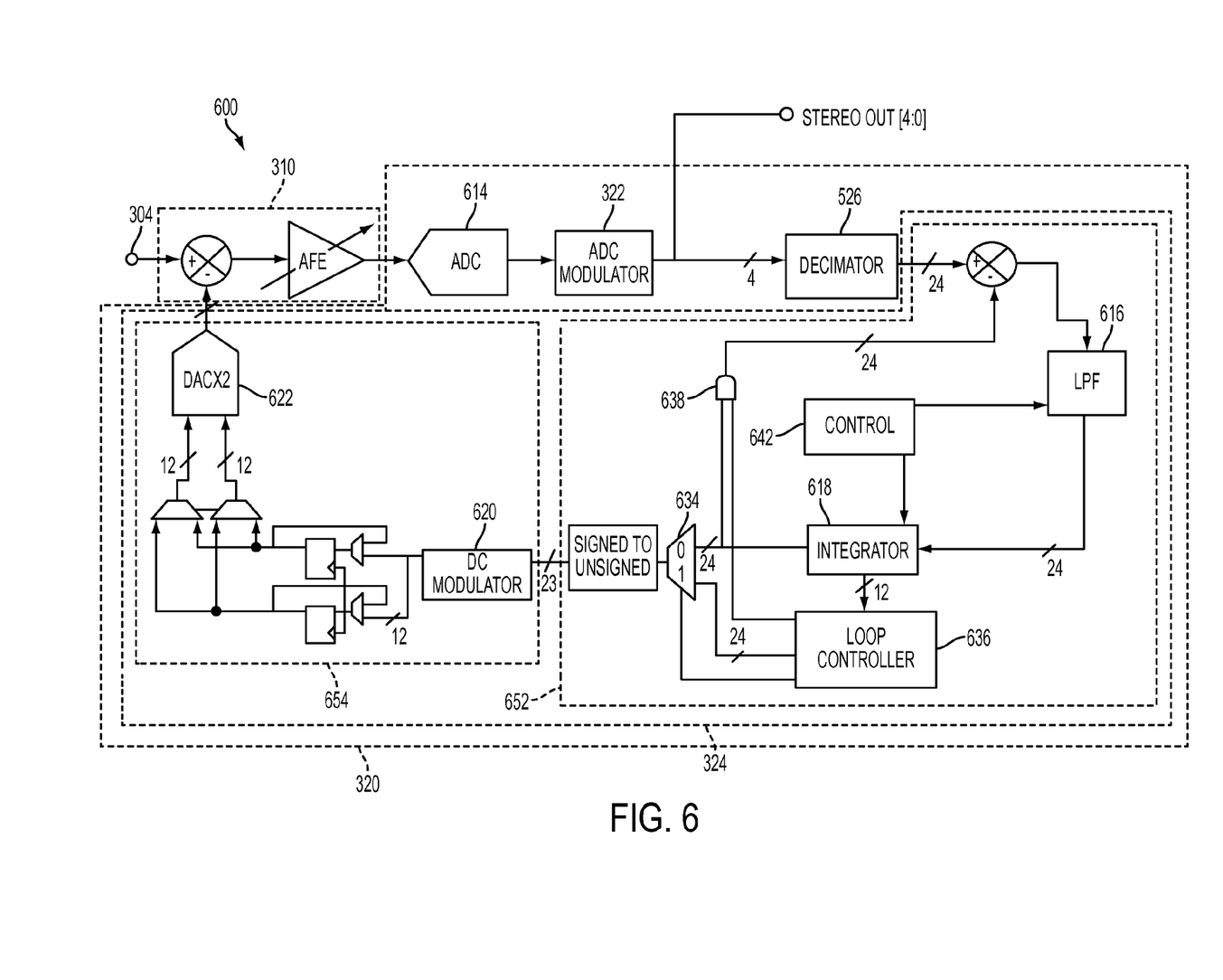
FIG. 6 is a circuit illustrating adjustment of DC offset with a DC servo loop for generating feedback according to one embodiment of the disclosure.

One embodiment of the DC servo loop 324 is described in greater detail with reference to FIG. 6. FIG. 6 is a circuit 600 illustrating adjustment of DC offset with a DC servo loop 324 for generating feedback according to one embodiment of the disclosure. The input node 304 may receive an input signal, such as a microphone input signal. The amplifier block 310 may receive the input signal from the node 304, and a feedback signal from the feedback loop 320. The output of the amplifier block 310 may be provided to an analog-to-digital converter (ADC) 614, an ADC modulator 322, and a decimator 526. The output of the decimator 526 may be coupled to the DC servo loop 324 for generating feedback in the feedback loop 320. According to one embodiment, the decimator 526 may be a decimation filter configured to perform anti-aliasing and/or down-sampling to reduce a sample rate of the input signal at the input node 304 from a first rate, such as 6 megahertz (MHz) to a second rate, such as 48 kilohertz (kHz).

The DC servo loop 324 may operate in two modes. In one mode, the DC servo loop 324 may perform digital loop tracking through a digital low-pass filter (LPF) 616 and a digital integrator 618. Digital loop tracking may maintain the second common mode of an output signal from the amplifier 310 by closing feedback through the digital low-pass filter (LPF) 616 and the digital integrator 618 when the first common mode of the input signal is less than a first threshold from the second common mode. In a second mode, the DC servo loop 324 may perform analog loop tracking through the digital low-pass filter (LPF) 616, the digital integrator 618, the DC modulator 620, and the digital-to-analog converter (DAC) 622. Analog loop tracking may adjust the second common mode of the output signal when the first common mode of the input signal is greater than a first threshold from the second common mode.

The digital low-pass filter (LPF) 616 may extract the DC component from the output of the decimator 526, such as with a second-order low-pass filter. The integrator 618 may receive the output of the low digital low-pass filter 616 and track a DC level of the input signal and output a signal to a multiplexor 634. A loop controller 636 may generate an output to the multiplexor 634 and generate an enable signal to the multiplexor 634 to select between the output of the integrator 618 and the loop controller 636. The loop controller 636 may also provide a signal to a logic gate 638, such as an AND gate. The logic gate 638 may enable or disable feedback from the integrator 618 to the digital low-pass filter (LPF) 616.

During digital loop tracking, the portion of the feedback loop 320 that affects the analog signal path from the input node 304 to the analog front end (AFE) 614 may be open. The DC offset tracking in the digital integrator 618 may be subtracted directly from the decimator 526 output. The DC servo loop 324 then tracks changes in the DC offset level of the input signal without disturbing the analog signal path. When the DC servo loop 324 is operating in digital loop tracking mode, the loop controller 636 outputs a signal to the logic gate 638 to pass the integrator 618 feedback to the low-pass filter (LPF) 616 and controls the mux 634 to select the output of loop controller 636.

According to one embodiment, the duration and slope of the DC ramp of the feedback loop 320 may be adjusted during digital tracking. A sign of the integrator 618 may be switched to control a duration of the DC ramp.

The DC servo loop 324 may make adjustments to minimize DC offset shifts and maintain the input signal centered at the desired common mode. When the tracked DC offset level exceeds a certain threshold, the DC servo loop 324 may enter analog tracking mode. In analog tracking mode, the DC offset accumulated during the digital loop tracking may be transferred to the amplifier block 310 to adjust the first common mode of the input signal to a second common mode. When the DC offset of the second common mode returns to a threshold range, the analog loop tracking mode may be disabled and the digital loop tracking mode may be enabled.

When the DC servo loop 324 is operating in an analog loop tracking mode, the loop controller 636 outputs a signal to the logic gate 638 to disable digital loop tracking and controls the mux 634 to select the output of integrator 618. The output of integrator 618 is then provided to the DC modulator 620, which may include a second or higher order delta-sigma modulator that noise shapes the DC representation from the integrator 618 and provide an output to the digital-to-analog converter (DAC) 622. The DC modulator 620 may reduce an effective code-to-code step size in a band to reduce the DC offset steps to an inaudible level.

According to one embodiment, analog loop tracking is delayed until an amplitude of the input signal exceeds a certain threshold. For example, when the input signal is an audio signal, during a quiet period of the audio signal, the analog loop tracking may introduce noise into the analog signal path to the analog front end (AFE) 612. Thus, the DC offset accumulated during digital loop tracking may not be transferred by the analog loop tracking until the amplitude of the input signal has exceeded a threshold, such that the noise introduced by the analog loop tracking may be masked.

Components of the DC servo loop 324 may be operated at different update rates, such as by operating from different clock signals. For example, a first portion 652, such as the digital tracking loop, may operate at a first update rate, while a second portion 654, such as the analog tracking loop, may operate at a second update rate. For example, the first portion 652 may operate at between approximately 10 kilohertz (kHz) and 1 megahertz (MHz), such as at 48 kilohertz or at the output rate of the decimator 526. Furthermore, the second portion 654 may operate at between approximately 1 megahertz (MHz) and 100 megahertz (MHz). According to one embodiment, the second portion 654 is configured to operate at an update rate faster than the first portion 652 to allow oversampling within the second portion 654. The faster update rate of the second portion 654 allows the analog loop tracking to introduce DC offset steps that are inaudible to the user.

Before analog loop tracking or digital loop tracking as described above, the DC servo loop 324 may initialize in a DC acquisition mode. During the DC acquisition mode, the feedback loop 320 may be enabled and the digital low-pass filter (LPF) 616 configured with a wide bandwidth, such as approximately 1 kilohertz (kHz), allowing the feedback loop 320 to settle approximately at a desired DC offset of the amplifier block 310. The LPF 616 may be adjusted by a control block 642 coupled to the LPF 616 and the integrator 618. The bandwidth of the LPF 616 may be configured over time to reduce the bandwidth of the LPF 616 to increase rejection of certain frequencies of the input signal, such as to reject audio frequencies. Configuring the bandwidth of the LPF 616 may allow the feedback loop 320 to converge faster toward a desired DC offset level, or common mode, by reducing the likelihood of saturation of the ADC 614 and the decimator 526 during start-up.

According to one embodiment, the DC acquisition mode may include two phases: a ground-side calibration and a signal-side calibration. For example, the DACs 532 and 534 of FIG. 5 may be calibrated separately. During the ground-side calibration, the output of amplifier 512 may be maintained at a fixed common mode level, such as a midpoint between the positive and negative supply rails. A code for the DAC 534 is selected and adjusted to reach the fixed common mode level at the output of amplifier 514. After the code for the DAC 534 corresponding to the ground-side is latched, a similar signal side calibration may begin. After a code for the signal-side is latched, the feedback loop 320 may be halted, the DAC 622 output codes frozen, and the DAC 622 output codes stored by the loop control block 636. Then, the circuit 600 may begin digital loop tracking of the input signal at the input node 304A.

Figure 7:
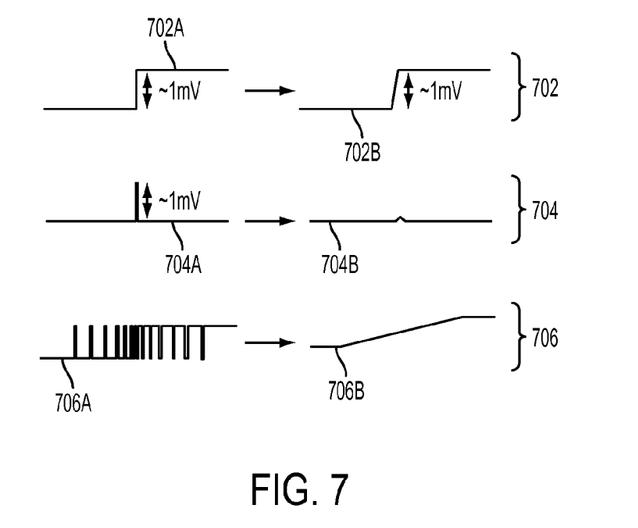
FIG. 7 is a graph illustrating DC offset shifts according to one embodiment of the disclosure.

FIG. 7 is a graph illustrating DC offset shifts according to one embodiment of the disclosure. Human perception of sounds may be modeled as a second-order low-pass filter, with cut-off frequencies at 20 hertz and 20 kilohertz. In interpreting a sound 702, a signal 702A with a DC offset shift of 1 milliVolt may be heard by a human as in output signal 702B. The DC offset shift in the output signal 702B causes audible glitches when the output signal 702B is an audio signal. The DC servo loop 324 of FIGS. 3, 5, and 6 described above may instead generate short DC offset adjustment pulses, as shown in signal 704A of sound 704. When the signal 704A is heard, the glitch in output signal 704B is reduced by the ear to a level that may be inaudible. A series of pulses, as shown in signal 706A of sound 706, may be introduced by the DC servo loop 324 to gradually increase output waveform 706B, which likewise may be inaudible to a user.

Figure 8:
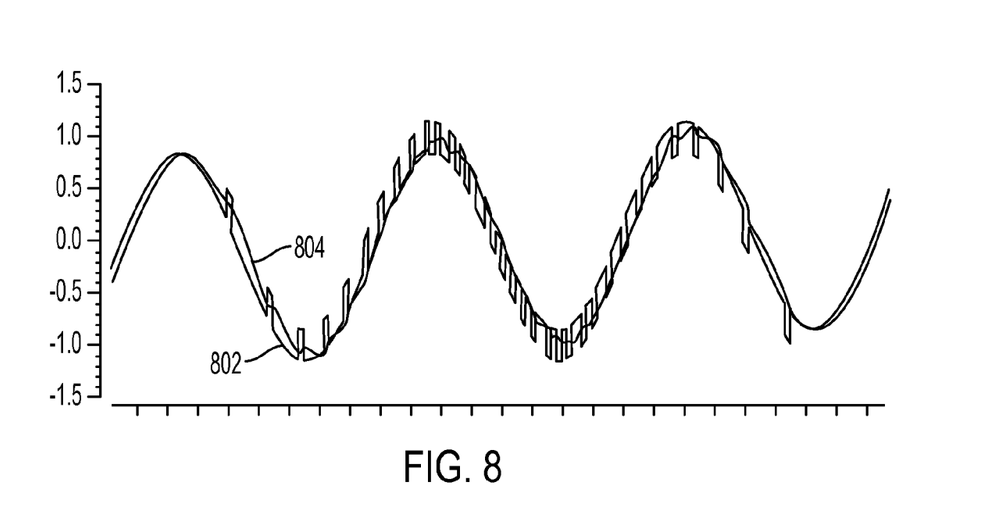
FIG. 8 is a graph illustrating the effect of DC offset shifts on an audio signal according to one embodiment of the disclosure.

FIG. 8 is a graph illustrating the effect of DC offset shifts on an audio signal according to one embodiment of the disclosure. A signal 802 may be the output signal including the DC offset shifts. The DC servo loop 324 of FIGS. 3, 5, and 6 may insert the DC offset shifts as a series of pulses into the signal 802. When the signal is processed by the processing circuitry, such as analog front end (AFE) 612 of FIG. 6, the resulting signal 804 includes glitches corresponding to the DC offset shifts of signal 802, but the resulting glitches may be inaudible to a user.

If implemented in firmware and/or software, the functions described above, such as described with reference to FIG. 4, may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   an input node configured to receive an input signal;
   an amplifier comprising a first amplifier input node, a second amplifier input node, and an amplifier output node, wherein the first amplifier input node is coupled to the input node; and
   a feedback loop coupled to the second amplifier input, wherein the feedback loop is configured to adjust a first common mode of the input signal to control a second common mode of an output signal at the amplifier output node, wherein the feedback loop comprises a mixed-signal servo loop and wherein the feedback loop is configured to:
      perform digital loop tracking through a digital low-pass filter (LPF) and a digital integrator; and
      perform analog loop tracking through the digital low-pass filter (LPF), the digital integrator, a direct current (DC) modulator, and a digital-to-analog converter (DAC).

2. The apparatus of claim 1, wherein the mixed-signal servo loop further comprises a digital decimator filter coupled to the analog-to-digital converter (ADC).

3. The apparatus of claim 1, wherein the feedback loop is configured to:
   perform analog loop tracking to adjust the second common mode of the output signal when the first common mode of the input signal is greater than a first threshold from the second common mode;
   perform digital loop tracking to substantially maintain the second common mode of the output signal when the first common mode of the input signal is less than the first threshold from the second common mode.

4. The apparatus of claim 3, wherein the feedback loop is further configured to delay analog loop tracking to adjust the second common mode of the output signal until an amplitude of the input signal is above a second threshold.

5. The apparatus of claim 2, wherein the direct current (DC) modulator comprises a delta-sigma modulator configured to perform noise shaping.

6. The apparatus of claim 1, wherein the input node comprises a microphone input, and wherein the input signal is an audio input signal.

7. An apparatus, comprising:
   an input node configured to receive an input signal, wherein the input node comprises a microphone input, and wherein the input signal is an audio input signal;
   an amplifier comprising a first amplifier input node, a second amplifier input node, and an amplifier output node, wherein the first amplifier input node is coupled to the input node;
   a feedback loop coupled to the second amplifier input, wherein the feedback loop is configured to adjust a first common mode of the input signal to control a second common mode of an output signal at the amplifier output node; and
   an analog-to-digital converter (ADC) coupled to the amplifier output node, wherein the first common mode is a common mode of the microphone input, and wherein the second common mode is a common mode of the analog-to-digital (ADC) converter,
   wherein the feedback loop comprises a mixed-signal servo loop and wherein the feedback loop is configured to:
      perform digital loop tracking through a digital low-pass filter (LPF) and a digital integrator; and
      perform analog loop tracking through the digital low-pass filter (LPF), the digital integrator, a direct current (DC) modulator, and the digital-to-analog converter (DAC).

8. The apparatus of claim 7, wherein the second common mode is approximately a midpoint between a supply voltage of the amplifier and a ground voltage of the amplifier.

9. The apparatus of claim 1, further comprising:
   a second input node configured to receive a second input signal, the second input signal comprising noise common to the first input signal and the second input signal; and
   a second amplifier comprising a third amplifier input node, a fourth amplifier input node, and a second amplifier output node, wherein the third amplifier input node is coupled to the second input node, and wherein the fourth amplifier input node is coupled to the feedback loop.

10. The apparatus of claim 9, further comprising a capacitor coupled between a ground and the second amplifier input node and a second capacitor coupled between the ground and the fourth amplifier input node.

11. A method, comprising:
receiving an input signal at an input node;
amplifying the input signal to generate an output signal by applying the input signal to a first amplifier input node of an amplifier; and
adjusting a first common mode of the input signal to a second common mode of the output signal during the step of amplifying the input signal, wherein the step of adjusting comprises feeding back a feedback signal through a mixed-signal servo loop from an output of the amplifier to a second amplifier input node of the amplifier, and wherein the step of feeding back comprises:
performing digital loop tracking through a digital low-pass filter (LPF) and a digital integrator; and
performing analog loop tracking through the digital low-pass filter (LPF), the digital integrator, a direct current (DC) modulator, and a digital-to-analog converter (DAC).

12. The method of claim 11, wherein the step of adjusting the first common mode of the input signal comprises adding high frequency noise to the input signal to generate the output signal.

13. The method of claim 11, wherein the step of applying feedback comprises:
performing the analog loop tracking to adjust the first common mode of the input signal when the first common mode of the input signal is greater than a first threshold from the second common mode; and
performing the digital loop tracking to adjust the first common mode of the input signal when the first common mode of the input signal is less than a first threshold from the second common mode.

14. The method of claim 13, further comprising delaying the analog loop tracking until a signal level of the input signal is above a second threshold.

15. The method of claim 13, wherein the step of executing digital loop tracking comprises updating at a first rate, and wherein the step of executing analog loop tracking comprises updating at a second rate slower than the first rate.

16. The method of claim 11, further comprising calibrating the feedback loop by adjusting a bandwidth of the digital low-pass filter (LPF) comprising:
initializing the digital low-pass filter at a first bandwidth; and
reducing the first bandwidth of the digital low-pass filter to a second bandwidth.

17. The method of claim 11, wherein the step of receiving an input signal comprises receiving a microphone audio signal.

18. The method of claim 17, further comprising the step of converting the output signal to a digital signal with an analog-to-digital converter (ADC), wherein the second common mode is a common mode of the analog-to-digital converter (ADC).

19. The method of claim 11, further comprising filtering the input signal to limit a bandwidth of the input signal to avoid aliasing during sampling of the input signal.

20. The apparatus of claim 1, wherein the feedback loop is configured for coarse adjusting of the first common mode to the second common mode and configured for fine adjusting of the first common mode to the second common mode.

21. The apparatus of claim 7, wherein the feedback loop is configured to:
perform analog loop tracking to adjust the second common mode of the output signal when the first common mode of the input signal is greater than a first threshold from the second common mode;
perform digital loop tracking to substantially maintain the second common mode of the output signal when the first common mode of the input signal is less than the first threshold from the second common mode.

22. The apparatus of claim 6, further comprising an analog-to-digital converter (ADC) coupled to the amplifier output node, wherein the first common mode is a common mode of the microphone input, and wherein the second common mode is a common mode of the analog-to-digital (ADC) converter.

* * * * *